United States Patent [19]

DiPiazza et al.

[11] Patent Number: 5,101,173

[45] Date of Patent: Mar. 31, 1992

[54] STORED PROGRAM CONTROLLED MODULE AMPLIFIER BIAS AND AMPLITUDE/PHASE COMPENSATION APPARATUS

[75] Inventors: Gerald C. DiPiazza, Boxford, Mass.; Mark J. Peterson, McKinney, Tex.

[73] Assignee: The United States of America as represented by the Secretary of the Air Force, Washington, D.C.

[21] Appl. No.: 620,507

[22] Filed: Nov. 28, 1990

[51] Int. Cl.[5] ............................................. H03G 3/20
[52] U.S. Cl. ...................................... 330/136; 330/144; 330/279; 330/284
[58] Field of Search ................................ 330/127-128, 330/136, 144, 145, 279, 284; 455/116, 126, 127

[56] References Cited

U.S. PATENT DOCUMENTS

| | | | |
|---|---|---|---|
| 3,900,823 | 8/1975 | Sokal et al. | 330/149 |
| 4,554,511 | 11/1985 | Braun | 330/9 |
| 4,600,892 | 7/1986 | Wagner et al. | 330/144 |
| 4,794,343 | 12/1988 | Yang | 330/2 |
| 4,859,964 | 8/1989 | Jorgensen | 330/279 |

OTHER PUBLICATIONS

Memo dtd. Dec. 22, 1983, from G. C. DiPiazza to Pierre Martin re: White Paper on Self-Contained Calibration, Fault Diagnosis, Performance Monitoring and Reconfiguration in MMIC Technology.

Paper dtd. Sep. 8, 1983, by Gerald C. DiPiazza on Technology Concepts re: (a) Broadband, Space Conservative, Microwave Integrated Networks, and (b) "Smart" Microwave Components.

Primary Examiner—James B. Mullins
Attorney, Agent, or Firm—William Stepanishen; Donald J. Singer

[57] ABSTRACT

A stored program amplifier compensation apparatus utilizing sensing elements to provide the operational states of an RF power amplifier to a controller processor unit which utilizes the operational data to provide a bias control signal to the RF power amplifier. Look-up tables which are stored in the controlled processor unit, contain a bias control signal for all the possible operational combinations.

7 Claims, 1 Drawing Sheet

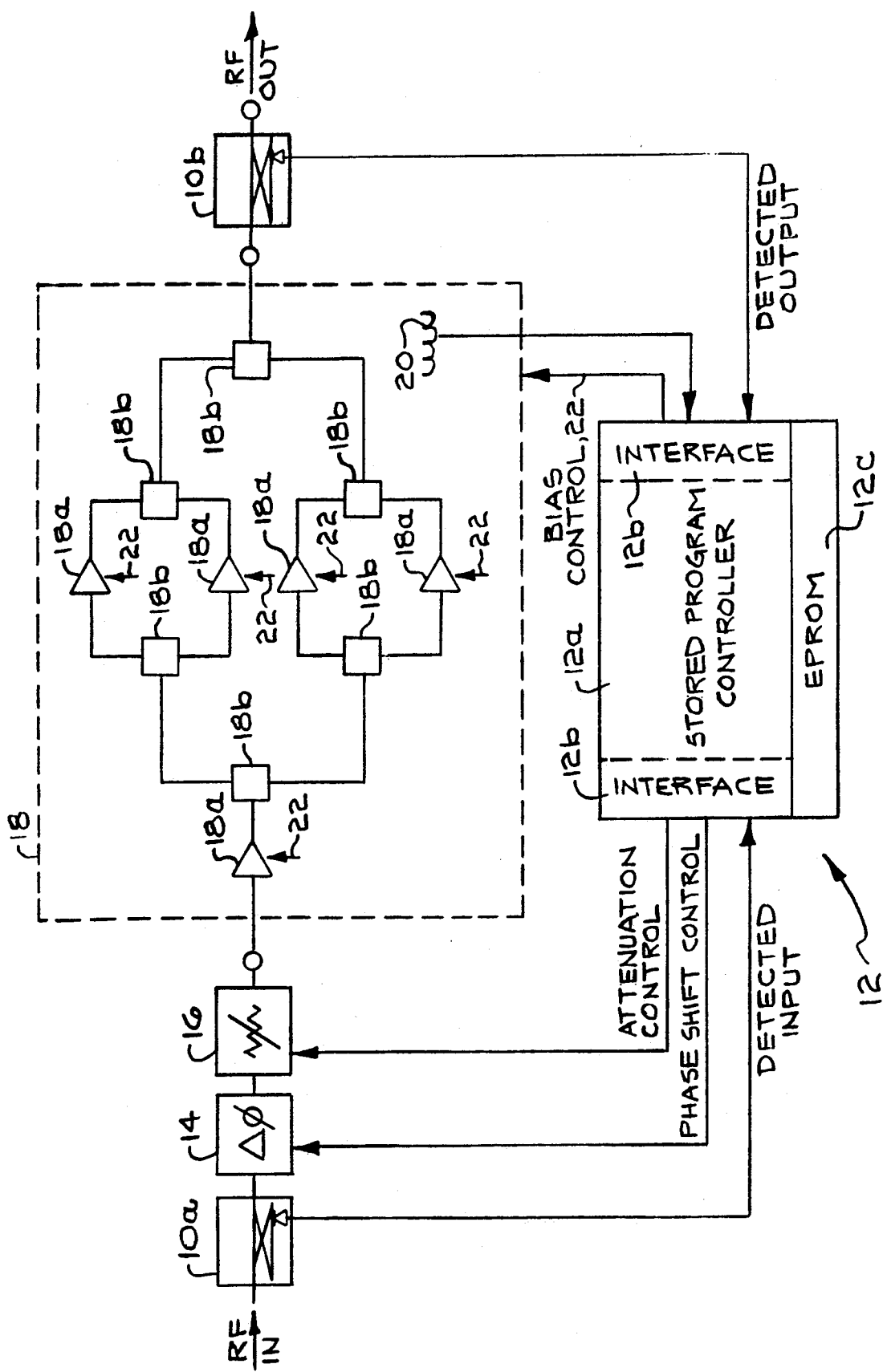

STORED PROGRAM CONTROLLED MODULE AMPLIFIER BIAS AND AMPLITUDE/PHASE COMPENSATION APPARATUS

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to an RF amplifier bias compensation apparatus and, more particularly, to a stored program controlled module amplifier bias and amplitude/phase compensation apparatus.

The prior state of the art of amplifier bias and amplitude/phase compensation apparatus is well represented by the prior art apparatus and approaches which are contained in the following U.S. Pat. Nos.:

U.S. Pat. No. 3,900,823 issued to Sokal et al on 19 Aug. 1975;
U.S. Pat. No. 4,554,511 issued to Braun on 19 Nov. 1985;
U.S. Pat. No. 4,794,343 issued to Yang on 27 Dec. 1988; and
U.S. Pat. No. 4,859,964 issued to JOrgensen on 22 Aug. 1989.

The Sokal et al patent is directed to a power amplifying and signal processing system for modulated carrier signals separately processing the amplitude component of the system input signal and the component of frequency or phase, or both frequency and phase, and later recombines the separately processed components to provide an output signal The amplitude and phase transfer functions of the system can be accurately controlled. The input signal is fed to a power amplifier whose output provides the output for the system. The input and output signals of the system are fed by separate paths to a comparator which compares both signals and emits an error signal to a controller. The controller regulates the amplitude and phase, or both, of the power amplifier's output to null the error signal The Braun patent discloses an offset voltage correction network for an instantaneous floating point amplifier which includes a cascaded amplifier preceded by a sample-and-hold network in normal fashion. Immediately preceding the sample-and-hold network, however, is a summing network to which the input data is applied from the input multiplexer. The summing network also has an analog offset correction voltage applied thereto in such a manner so as to subtract the offset component from the input data as it is applied. This offset voltage is derived from a digital-to-analog device to which a digitally stored value of dc offset is applied.

The Yang patent describes a method for calibrating a parameter of amplifier gain. The parameter of the amplifier gain is responsive to the function of a control signal coupled to the amplifier and is characterized by being determined by at least one functional constant The method comprises the steps of measuring at least one functional constant of the amplifier gain at a corresponding predetermined value of the control signal. The method continues with the step of changing the functional parameter of the amplifier to another predetermined calibrated value according to the measured other functional constant. By reason of this combination of steps, the parameter of the amplifier gain is calibrated to assume the predetermined calibrated value without the use of additional test equipment.

The Jorgensen patent discusses a system for automatically readjusting the gain of an amplifier so that the dynamic range of an input analog signal does not exceed a predetermined digital word length which includes a digitally controlled amplifier. Output of the amplifier is coupled to an analog-to-digital converter. Output of the analog-to-digital converter is coupled to a microprocessor system. A digitized representation of the input signal is stored in the microprocessor system. The microprocessor system then compares amplitude values of the stored digital representation with predetermined upper and lower limit values.

While the above-cited references are instructive, they do not address the implementation and performance features of the present invention.

SUMMARY OF THE INVENTION

The utilization property of the present invention is the maintenance of high power-added efficiency and the transfer function properties (as a function of temperature) of a high power RF amplifier system as the input (and consequently output) RF power is varied. The invention utilizes a stored program controller to provide both prime power bias adjustment and RF amplitude and phase correction to achieve the utilization property. The controller unit comprises a logic unit which can be either hard wired or programmable and embodies look-up tables embedded in memory. The apparatus comprises a stored program controller having a programmable memory, an input interface and an output interface. A couple/detector is used to sense the power level of the input RF signal which is then conveyed to the input interface of the stored program controller. The RF signal is then conveyed to amplitude and phase trimmer circuits which receive control signals from the programmable controller. The output of the amplitude and phase trimmer circuits is applied to the driver stage of a cascade of power amplifiers. Each stage of the cascade of power amplifier receives a bias control signal from the controller. The RF output of the power amplifier cascade is applied to and sensed by an output coupler/detector. The detected output RF signal is then conveyed to the stored program controller. In operation, the controller compares the input and output detected signals with internal references and by means of a look-up table converts the results in DC bias, amplitude and phase trim signals which are applied to the power amplifier stages and amplitude and phase trimmer circuits to limit bias power consumption as a function of the input RF power being processed. The phase shift and amplitude trim circuits compensate amplitude and phase shift variations contributed by the bias adjustments. Finally, the controller signal to the amplitude trim circuit is used to set overall module insertion gain.

It is one object of the invention to provide an improved stored program controlled module amplifier bias and amplitude/phase compensation apparatus.

It is another object of the invention to provide an improved amplifier bias compensation apparatus in which the DC bias current and voltage are simultaneously adjusted to keep the power amplifier operating in a high-efficiency mode.

It is another object of the invention to provide an improved amplifier bias compensation apparatus which utilized stored program technology and resident lookup tables to control the precise DC bias and module state settings to maintain high power-added efficiency and RF module insertion performance with frequency over wide dynamic ranges in RF power processed by the module.

It is yet another object of the invention to provide an improved amplifier bias compensation apparatus which maintains close tolerance of module insertion gain, module insertion phase shift or both module insertion gain and phase shift over a 30 dB range in output power level and for a wide range in ambient temperature.

It is still another object of the invention to provide an improved amplifier bias compensation apparatus which maintains a high power-added efficiency over a wide dynamic range from maximum output power and over wide range in ambient temperature while maintaining a prescribed tolerance upon module insertion gain and/or phase shift.

It is a further object of the invention to provide an improved amplifier bias compensation apparatus which optimizes power added efficiency over a wide dynamic range of output power including maximum power with provisions for temperature compensation and the maintenance of closely toleranced module insertion gain and phase shift characteristics.

It is a yet another object of the invention to provide an improved amplifier bias compensation apparatus which reduces the life cycle cost because it compensates for the specific personality of each of the primary RF path components during manufacturing and may maintain a running log of operations for ease of maintenance and troubleshooting during use.

These and other advantages, objects and features of the invention will become more apparent after considering the following description taken in conjunction with the illustrative embodiment in the accompanying drawings.

BRIEF DESCRIPTION OF THE DRAWINGS

The sole FIGURE is a block diagram of a microprocessor controlled, variable output, high efficiency, high power RF amplifier apparatus according to the present invention.

DESCRIPTION OF THE PREFERRED EMBODIMENT

Referring now to the sole Figure, there is shown a block diagram of the stored program controlled module amplifier bias and amplitude/phase compensation apparatus. An RF signal is applied to input coupler/detector unit 10a which detects and couples a portion of the RF signal to the microprocessor unit 12. The phase trimmer unit 14 receives the RF signal from the input coupler/detector unit 10a and applies it to the amplitude trimmer unit 16. The amplitude trimmer unit 16 is coupled to the microwave power amplifier unit 18. The RF signal is amplified in the power amplifier unit 18 and is applied to the output coupler/detector unit 10b to provide an RF output signal. A temperature sensing unit 20 is positioned on the power amplifier unit 18 to provide temperature data to the microprocessor unit 12. It should be noted that any necessary number of temperature sensing units may be utilized at a variety of locations as the application may require.

The microprocessor unit 12 receives signals from the sampling elements such as the directional detectors, and the temperature sensing elements to control the RF performance and prime power consumption of the power amplifier unit 18. The microprocessor comprises a stored-program controller 12a, an EPROM 12c and interface units 12b. The controller is, in its simplest form, a logic unit which can be either hard wired or programmable and an arithmetic unit which embodies computational algorithms, and memory. The stored-program and appropriate look-up tables embedded in memory are used by the logic unit to tune the RF performance and/or adjust the output power of the amplifiers. This is accomplished by controlling the DC bias conditions as a function of the controlling signals provided by the directional detectors and the temperature sensing elements and/or other externally applied signals. Digital/analog and analog/digital conversions between the processor and analog RF functions are implemented by means of the driver and interface function. An erasable programmable read only memory (EPROM) 12C is utilized to provide the memory function and provides ease in data modification and management.

The power amplifier unit 18 may comprise a gallium arsenide (GaAs) microwave monolithic integrated circuit which may be configured to satisfy a particular circuit configuration or application. In the present example, five driver stage units 18a are arranged in a series-parallel configuration. Each driver stage unit 18a receives a bias control signal 22 from the microprocessor unit 12. Hybrid power splitter units 18b are utilized to couple the RF power between the driver stage units 18a and finally to the output coupler/detector unit 10b.

The stored program controlled module amplifier bias and amplitude/phase compensation apparatus operates and functions in the following manner. In order to achieve the 30 dB control range in gain and to compensate the amplitude and phase shift variations which result from DC amplifier bias control, an amplitude/phase shift resolver and a variable attenuator is utilized at the input to the amplifier module. The controller is driven by external control signals which call for specific module states of insertion gain and output power. The controller, by means of a look-up table, converts the control levels into DC bias signals to the power amplifier stages which thus limits bias power consumption as a function of the RF power being processed. The controller also uses the stored tables to provide signals to the resolver (phase shift and amplitude trim) to compensate amplitude and phase shift variations contributed by the bias adjustments. Finally, the controller supplies signals to the variable attenuator to set the overall module insertion gain.

The application of stored-program control technology to RF subassembly operation provides enormous functional flexibility making it difficult to identify the variety of architectural and operational permutations that are possible. The two possible applications cover cases where the module insertion gain is fixed while RF power output is varied and where module insertion gain is varied—both cases requiring the maintenance of high power-added efficiencies within 10 dB of maximum output power. The present bias control technique is novel in the fact that DC bias current and voltage to the power amplification devices are simultaneously adjusted to keep the power amplification devices operating in a high-efficiency mode in the cases described at or near the 1 dB compression point while the RF power being processed by the devices is varied over a substantial dynamic range, i.e., within 10 dB of maximum output power. The use of stored program technology and resident look-up or personality tables to effect the precise DC bias and module state settings to maintain high power-added efficiency and RF module insertion performance with frequency over wide dynamic ranges in RF power processed by the module provides a substantial improvement in control and operation of cascaded RF power amplifier units.

The apparatus, as described, provides a capability to maintain close tolerance on prescribed module insertion gain or module insertion phase shift or both module insertion gain and phase shift over a 30 dB range in output power level and for a wide range in ambient temperature.

The apparatus also provides a capability to maintain a high power-added efficiency over a 10 dB range from maximum output power and over a wide range in ambient temperature while maintaining a prescribed tolerance upon module insertion gain and/or phase shift.

The present invention has the flexibility to accommodate the functional range of performance described above for a variety of module architectures and gain blocks.

The invention provides a means to optimize power added efficiency over a 10 dB range of output power including maximum power with provision for temperature compensation and the maintenance of closely toleranced module insertion gain and phase shift characteristics.

The bias compensation apparatus provides a means of reducing the cost of manufacture because it compensates for the specific "personality" of each of the primary RF path components. The compensation takes the form of a "personality" or "look-up" table stored in memory and addressed as a means to establish the required bias voltages and currents to optimize the performance of each module state. This process can be completely automated as a part of the module assembly and test procedure. In effect, the module stored program controller has the capability to interact with an external test facility to "learn" and implement the bias compensations necessary to optimize module performance.

The bias compensation apparatus has the capacity to reduce the cost of troubleshooting during the repair cycle by using the stored program controller to provide machine based prompts for the testing algorithms as well as storage for a service history as part of the look-up data base. In this manner, the repair history can serve as a means to expose latent defects and minimize the cycle time necessary to correct defects due to infant mortality.

The major technical difference which distinguishes this invention from prior art is the use of a stored program controller and an installed "look-up" table to establish the optimum bias voltage and currents to the module power stages to maintain high power-added efficiency. When this is done, the module insertion phase shift and/or gain requires trimming which is also accommodated by the stored look-up table and the application of compensating bias to a gain and phase trim network. Other approaches achieve high power added efficiency using complex analog switching means to turn appropriate module power and gain stages on or off as necessary. The stored program approach provides a much more flexible, software-based means to achieve the same results.

Although the invention has been described with reference to a particular embodiment, it will be understood to those skilled in the art that the invention is capable of a variety of alternative embodiments within the spirit and scope of the appended claims.

What is claimed is:

1. An RF amplifier compensation apparatus comprising in combination:

means for amplifying an RF signal, said amplifying means having an input and an output, said amplifying means receiving said RF signal at said input, said amplifying means amplifying said RF signal and providing an RF output signal at said output, said amplifying means providing power amplification which may be varied by a bias control signal, means for sensing the operational state of said amplifying means, said sensing means operatively coupled to said input and output of said amplifying means, said sensing means sensing said RF signal to determine the power level in, amplitude and phase of said RF signal at the input of said amplifying means, said sensing means sensing the power level out of said RF output signal at the output of said amplifying means, means for controlling said operational state of said amplifying means, said controlling means operatively coupled to said sensing means to receive therefrom state signals, said state signals comprise the power level in, amplitude and phase of said RF signal and the power level out of said RF output signal, said controlling means utilizing said state signals to determine a bias control signal which corresponds to said state signals, said bias control signals are stored in a memory in said controlling means, a bias control signal is provided for each combination of said state signals, said controlling means providing a bias control signal to said amplifying means in response to said state signals.

2. An RF amplifier compensation apparatus as described in claim 1 wherein said amplifying means comprises a plurality of driver stages, each driver stage of said plurality of driver stages being individually variable in gain, and, a plurality of power splitters respectively coupled to said plurality of driver stages to form a cascaded power amplifier unit.

3. An RF amplifier compensation apparatus as described in claim 1 wherein said controlling means comprise a stored program controller unit.

4. An RF amplifier compensation apparatus as described in claim 1 wherein said sensing means includes means for sensing and controlling the phase of said RF signal and means for sensing and controlling the amplitude of said RF signal, said phase and amplitude sensing and controlling means providing signals to said controlling means and receiving phase and amplitude signals from said controlling means.

5. An RF amplifier compensation apparatus as described in claim 4 wherein said amplitude sensing and controlling means further includes a variable attenuator to control insertion gain, said variable attenuator receiving as insertion gain control signal from said controlling means to control the insertion gain of said amplifying means.

6. An RF amplifier compensation apparatus as described in claim 1 wherein said controlling means contains look-up tables which are stored in memory, said look-up tables containing a plurality of bias control signals which represent a bias control signal for each of the possible sensed operational states.

7. An RF amplifier compensation apparatus as described in claim 1 wherein said sensing means further includes a means for sensing temperature in said amplifying means.

* * * * *